United States Patent
Koukitu et al.

(10) Patent No.: US 7,645,340 B2
(45) Date of Patent: Jan. 12, 2010

(54) VAPOR PHASE GROWTH METHOD FOR A1-CONTAINING III-V GROUP COMPOUND SEMICONDUCTOR, AND METHOD AND DEVICE FOR PRODUCING A1-CONTAINING III-V GROUP COMPOUND SEMICONDUCTOR

(75) Inventors: Akinori Koukitu, Koganei (JP); Yoshinao Kumagai, Koganei (JP); Tomohiro Marui, Koganei (JP)

(73) Assignee: Tokyo University Agriculture and Technology TLO Co., Ltd., Tokyo (JP)

( * ) Notice: Subject to any disclaimer, the term of this patent is extended or adjusted under 35 U.S.C. 154(b) by 102 days.

(21) Appl. No.: 10/509,177

(22) PCT Filed: Apr. 7, 2003

(86) PCT No.: PCT/JP03/04408

§ 371 (c)(1),
(2), (4) Date: Sep. 27, 2004

(87) PCT Pub. No.: WO03/085711

PCT Pub. Date: Oct. 16, 2003

(65) Prior Publication Data

US 2005/0166835 A1    Aug. 4, 2005

(30) Foreign Application Priority Data

Apr. 9, 2002    (JP) .............................. 2002-106102

(51) Int. Cl.
*C30B 25/00*    (2006.01)
(52) U.S. Cl. .............................. 117/91; 117/84; 117/88; 117/89; 117/99; 117/200; 117/204; 117/952
(58) Field of Classification Search .................... 117/84, 117/88, 89, 91, 99, 200, 204, 952
See application file for complete search history.

(56) References Cited

U.S. PATENT DOCUMENTS 3,471,324 A    10/1969    Wilson et al.
4,698,244 A *  10/1987    Benander et al. ............ 427/253

(Continued)

FOREIGN PATENT DOCUMENTS

EP    1 184 488 A2    3/2002

(Continued)

OTHER PUBLICATIONS

Supplemental European Search Report, Sep. 7, 2007.

*Primary Examiner*—Robert M Kunemund
*Assistant Examiner*—Matthew J Song
(74) *Attorney, Agent, or Firm*—Oliff & Berridge, PLC (57) ABSTRACT

A method for growing a crystal of an Al-containing III-V group compound semiconductor by the conventional HVPE method, characterized in that it comprises a step of reacting Al with hydrogen halide at a temperature of 700° C. or lower to form a halide of Al. The method has allowed the suppression of the formation of aluminum chloride (AlCl) or aluminum bromide (AlBr) reacting violently with quartz, which is the material of a reaction vessel for the growth, resulting in the achievement of the vapor phase growth of an Al-containing III-V group compound semiconductor at a rate of 100 microns/hr or more, which has lead to the mass-production of a substrate and a semiconductor element having satisfactory resistance to adverse environment.

19 Claims, 5 Drawing Sheets

U.S. PATENT DOCUMENTS

| | | | |
|---|---|---|---|
| 4,888,303 | A | 12/1989 | Quinlan |
| 6,156,581 | A | 12/2000 | Vaudo et al. |
| 6,177,292 | B1 * | 1/2001 | Hong et al. ............... 438/46 |
| 6,197,683 | B1 * | 3/2001 | Kang et al. ............... 438/643 |
| 6,218,269 | B1 * | 4/2001 | Nikolaev et al. ............ 438/518 |
| 6,533,874 | B1 * | 3/2003 | Vaudo et al. ............... 148/33.5 |
| 2002/0025661 | A1 | 2/2002 | Nikolaev et al. |

FOREIGN PATENT DOCUMENTS

| | | |
|---|---|---|
| JP | 63073617 A | 4/1988 |
| JP | A-03-218917 | 9/1991 |
| JP | A-05-327398 | 12/1993 |
| JP | A-08-157299 | 6/1996 |
| JP | A 10-215000 | 8/1998 |
| JP | A 10-316498 | 12/1998 |
| JP | A-2000-031060 | 1/2000 |
| JP | A-2000-091234 | 3/2000 |
| JP | A-2000-223418 | 8/2000 |
| JP | A-2001-181097 | 7/2001 |
| JP | A-2001-313254 | 11/2001 |
| JP | A-2002-173393 | 6/2002 |
| JP | A 2003-515257 | 4/2003 |
| JP | A-2005-057196 | 3/2005 |
| JP | A-2005-223243 | 8/2005 |
| WO | WO 00/68470 | 11/2000 |
| WO | WO 01/38600 A1 | 5/2001 |

* cited by examiner

FIG. 6 and DEVICE FOR PRODUCING Al-CONTAINING
VAPOR PHASE GROWTH METHOD FOR Al-CONTAINING III-V GROUP COMPOUND SEMICONDUCTOR, AND METHOD AND DEVICE FOR PRODUCING Al-CONTAINING III-V GROUP COMPOUND SEMICONDUCTOR

TECHNICAL FIELD

The present invention relates to a method and a device for producing a thick layer of an Al-containing III-V group compound semiconductor with a thickness of 100 microns or greater. As used herein, the term "Al-containing III-V group compound semiconductor" is intended to encompass all III-V group compound semiconductors containing aluminum (Al), a group III element. Specific examples are AlN, AlGaN, AlGaInP, and AlInGaN. These semiconductors may contain group III elements, such as Al, Ga, and In, and group V elements, such as N and P, at any proportion.

BACKGROUND ART

Al-containing III-V group compound semiconductors have been, and will be, of significant importance. One reason is that their large band gap energy permits light emission at shorter wavelengths, or UV band, which cannot be achieved by other semiconductors. AlN, for example, has a band energy gap of 5 to 6 eV. In comparison, the band gap of GaN, a compound known to have relatively large band gap, is at most about 3.5 eV.

Al-containing III-V compound semiconductors can be used to make various light sources that operate at different wavelength bands, such as high intensity light-emitting diodes used in various display devices, lasers used for reading/writing CDs and DVDs, and lasers for optical communication. These semiconductor light sources are essential in the modern IT society.

Another reason that Al-containing III-V group compound semiconductors are so important also comes from their large band gap energy: they can be used to make harsh environment-resistant semiconductors that are less susceptible to malfunctions when exposed radiation. The term "harsh environment" as used herein includes an environment surrounding a radiation source such as nuclear reactor, and an environment in which flying objects and artificial satellites are exposed to cosmic rays when flying at high altitudes.

This characteristic band gap is brought about by the presence of aluminum (Al). Accordingly, Al-containing III-V group compound semiconductors, such as AlN, AlGaN, and AlGaInP, that contain different amounts of aluminum, a group III element, are needed to serve as the core of the above-described semiconductor light sources and harsh environment-resistant semiconductors.

In general, light-emitting parts of the semiconductor light sources and operative parts of the harsh environment-resistant semiconductors are formed by depositing a thin layer of a few microns or less in thickness. This can be done by using known techniques such as liquid phase epitaxy (LPE), molecular beam epitaxy (MBE), and metalorganic vapor phase epitaxy (MOVPE).

These deposition processes, however, require the use of a "substrate" that is 100 micron or greater in thickness. Such a substrate is difficult to fabricate by any of the LPE, MBE, and MOVPE techniques: the MBE and MOVPE, though suitable for depositing a thin layer of a few microns or thinner, take substantial amounts of time to form a thick layer of 100 microns or thicker and are therefore not practical.

On the other hand, LPE is suitable for growing a relatively thick layer of up to about 100 microns but the technique is not appropriate for growing a layer over a large area or for the mass production of layers due to the nature of the growing technique. Specifically, the LPE technique, which involves melting a metal into a liquid phase to form a layer, has drawbacks including high energy required in the melting process and insufficient "wetting" of the substrate with the melt. These drawbacks make the technique less practical.

Another technique, known as hydride vapor phase epitaxy (HVPE), is used for depositing a 100-micron or thicker layer. The HVPE technique involves sending a gas current of a halogenated product of Ga or In so that it can react with a hydrogenated product of a group V element to form a compound semiconductor. This technique is suitable for making thicker layers and is sometimes referred to as "halide vapor phase epitaxy."

The HVPE technique uses a quartz reaction tube and is of a hot wall type, in which not only the crystal growth area but also the surrounding quartz reaction tube is heated to a high temperature. In comparison, the MOVPE technique is of a cold wall type, in which only the substrate crystal is heated, but not the surrounding quartz reaction tube. Also, the above-mentioned MBE technique uses an ultra high vacuum chamber and no quartz is included in the reaction system.

A quartz reaction tube hot wall type, the HVPE technique has an advantage of particularly fast growth. For this reason, the technique has been used in the production of high sensitivity photosensors that require thick layers and power devices that require a thick, high-quality crystal (in particular, power source devices using GaAs). It is also used in the production of above-described substrates, in particular, GaN substrates. These applications are described in, for example, Japanese Patent Laid-Open Publication No. Hei 10-215000 entitled "Process for growing crystal of gallium nitride-containing compound semiconductor (TOYODA GOSEI K. K. et al.)" and Japanese Patent Laid-Open Publication No. Hei 10-316498 entitled "Epitaxial wafer and production method thereof (SUMITOMO DENKO K. K.)."

When an attempt is made to employ the MBE or MOVPE technique to grow, via heteroepitaxy, an Al-containing semiconductor, such as AlGaN, on a GaN substrate fabricated by the HVPE, the difference in the lattice constant or in the coefficient of thermal expansion between the substrate and the deposited layer causes cracks to form in the Al-containing crystal formed on the GaN layer. This has kept many application devices from being realized.

To address this problem, it was suggested to use the HVPE technique to make the substrate for the Al-containing III-V group compound semiconductor. This approach, however, had a significant problem: the halogenated product of aluminum (e.g., AlCl and AlBr) vigorously reacts with the quartz-made reaction vessel due to the nature of aluminum as a group III element. This reaction results in contamination of the compound semiconductor with Si from the quartz reaction vessel. Moreover, the quarts vessel may itself be damaged. For these reasons, the Al-based HVPE technique has been considered unsuitable for the epitaxial growth of semiconductors despite the high growth rate, and thus, the high productivity offered by the technique.

DISCLOSURE OF THE INVENTION

Accordingly, it is an object of the present invention to produce a substrate for Al-containing III-V group compound semiconductors by using the HVPE technique. Once the technology that permits the mass production of the Al-containing III-V group compound semiconductors by the use of the HVPE technique is established, the crack formation due to the difference in the lattice constant or in the coefficient of thermal expansion between the substrate and the deposited layer can be avoided during heteroepitaxial growth of, for example, AlGaN on the substrate. As a result, many application devices can be realized.

It is another object of the present invention to provide a method and a device suitable for the production of a thick layer device of the Al-containing III-V group compound semiconductors that can be used to form a harsh environment-resistant semiconductor that is less susceptible to malfunctions caused by radiation.

The present invention has achieved the above-described objects by providing a method for growing a crystal of an Al-containing III-V group compound semiconductor by vapor phase epitaxy. The method includes the step of reacting Al with a halogenated hydrogen at a temperature of 700° C. or below so as to form a halogenated product of Al. The Al-containing III-V group compound semiconductor is a semiconductor that contains Al as a group III element.

Specifically, by carrying out the reaction of Al with the halogenated hydrogen at a temperature of 700° C. or below, the dominant species of the resulting halogenated products of Al shifts from the monohalogenated product, which readily reacts with quartz, to the trihalogenated product, which hardly reacts with quartz. As a result, the reaction of the quartz-made reaction vessel, which has been a long concern in the art, is avoided.

Specific examples of the trihalogenated products of Al are aluminum trichloride (AlCl$_3$) and aluminum tribromide (AlBr$_3$). By maintaining the reaction system at a temperature of 700° C. or below, the present invention has suppressed the generation of the monohalogenated products, such as aluminum chloride (AlCl) and aluminum bromide (AlBr), which vigorously react with the quartz-made reaction vessel.

According to the present invention, the trihalogenated product of Al is transported to the growth area where the halogenated product is reacted with a hydrogenated product of a group V element at a temperature of 700° C. or above to grow (in the vapor phase) an Al-containing III-V group compound semiconductor on the seed crystal (substrate crystal) of, for example, sapphire (Al$_2$O$_3$) and Si. This is the same procedure as that followed in known HVPE techniques. The principle of the present invention is derived using thermodynamic analysis and is an achievement by the present inventors. This is described in the following.

The present invention is preferably implemented in conjunction with the HVPE technique. In carrying out the reaction to produce halogenated products according to HVPE, metallic Al or a mixture of metallic Al and metallic Ga is placed in a quartz reaction tube. To this tube, a carrier gas, which is a mixture of hydrogen (H$_2$) and an inert gas (IG), is introduced along with a gaseous hydrogen chloride (HCl).

Seven different species of gas, namely, AlCl$_3$, AlCl, GaCl$_3$, GaCl, HCl, H$_2$, and IG, can exist in the vicinity of the metal material during the heating of the reaction tube.

The halogenated products of Al and Ga are produced in the reactions shown below by the chemical equations 1 through 4, each representing a chemical equilibrium. The equilibrium constants of these equations are shown below by the respective mathematical equations 1 through 4.

Al(s)+2HCl(g)⇌AlCl$_3$(g)+3/2H$_2$(g)      [Chemical equation 1]

[equilibrium constant K1]

AlCl$_3$(g)+H$_2$(g)⇌AlCl(g)+2HCl(g)      [Chemical equation 2]

[equilibrium constant K2]

Ga(s)+3HCl(g)⇌GaCl$_3$(g)+3/2H$_2$(g)      [Chemical equation 3]

[equilibrium constant K3]

GaCl$_3$(g)+H$_2$(g)⇌GaCl(g)+2HCl(g)      [Chemical equation 4]

[equilibrium constant K4]

$$K1 = \frac{P_{AlCl_3} \cdot P_{H_2}^{3/2}}{a_{Al} \cdot P_{HCl}^3}$$ [Mathematical equation 1]

($P_*$ represents a partial pressure of gas $*$.

$a_{Al}$ is the activity of Al.)

$$K2 = \frac{P_{AlCl} \cdot P_{HCl}^2}{P_{AlCl_3} \cdot P_{H_2}}$$ [Mathematical equation 2]

$$K3 = \frac{P_{GaCl_3} \cdot P_{H_2}^{3/2}}{a_{Ga} \cdot P_{HCl}^3}$$ [Mathematical equation 3]

($a_{Ga}$ is the activity of Ga.)

$$K4 = \frac{P_{GaCl} \cdot P_{HCl}^2}{P_{GaCl_3} \cdot P_{H_2}}$$ [Mathematical equation 4]

The activities of Al and Ga in the mathematical equations 1 and 3 are defined as proportions of Al and Ga in the metal mixture, respectively. The mathematical equation 5 shows the limiting conditions of pressure in the reaction system. The right hand side of the mathematical equation 5 represents the total pressure of the system (1 atm).

AlCl$_3$(g)+AlCl(g)+GaCl$_3$(g)+GaCl(g) +HCl(g)+H$_2$(g)+IG(g)=1 (atm)      [Mathematical equation 5]

The parameter A to show the proportion of chloride with respect to hydrogen and the inert gas is given by the mathematical equation 6 below, while the parameter F to show the proportion of hydrogen in the carrier gas is given by the mathematical equation 7 below. These parameters remain constant since none of hydrogen, chloride, and the inert gas (IG) does not crystallize into a solid phase. Thus, each parameter can be used in calculation and can be regarded as the quantity that can be manipulated during the actual process.

$$A = \frac{\frac{3}{2}P_{AlCl_3} + \frac{1}{2}P_{AlCl} + \frac{3}{2}P_{GaCl_3} + \frac{1}{2}P_{GaCl} + \frac{1}{2}P_{HCl}}{\frac{1}{2}P_{HCl} + P_{H_2} + P_{IG}}$$ [Mathematical equation 6]

$$F = \frac{\frac{1}{2}P_{HCl} + P_{H_2}}{\frac{1}{2}P_{HCl} + P_{H_2} + P_{IG}}$$ [Mathematical equation 7]

Figure 1:
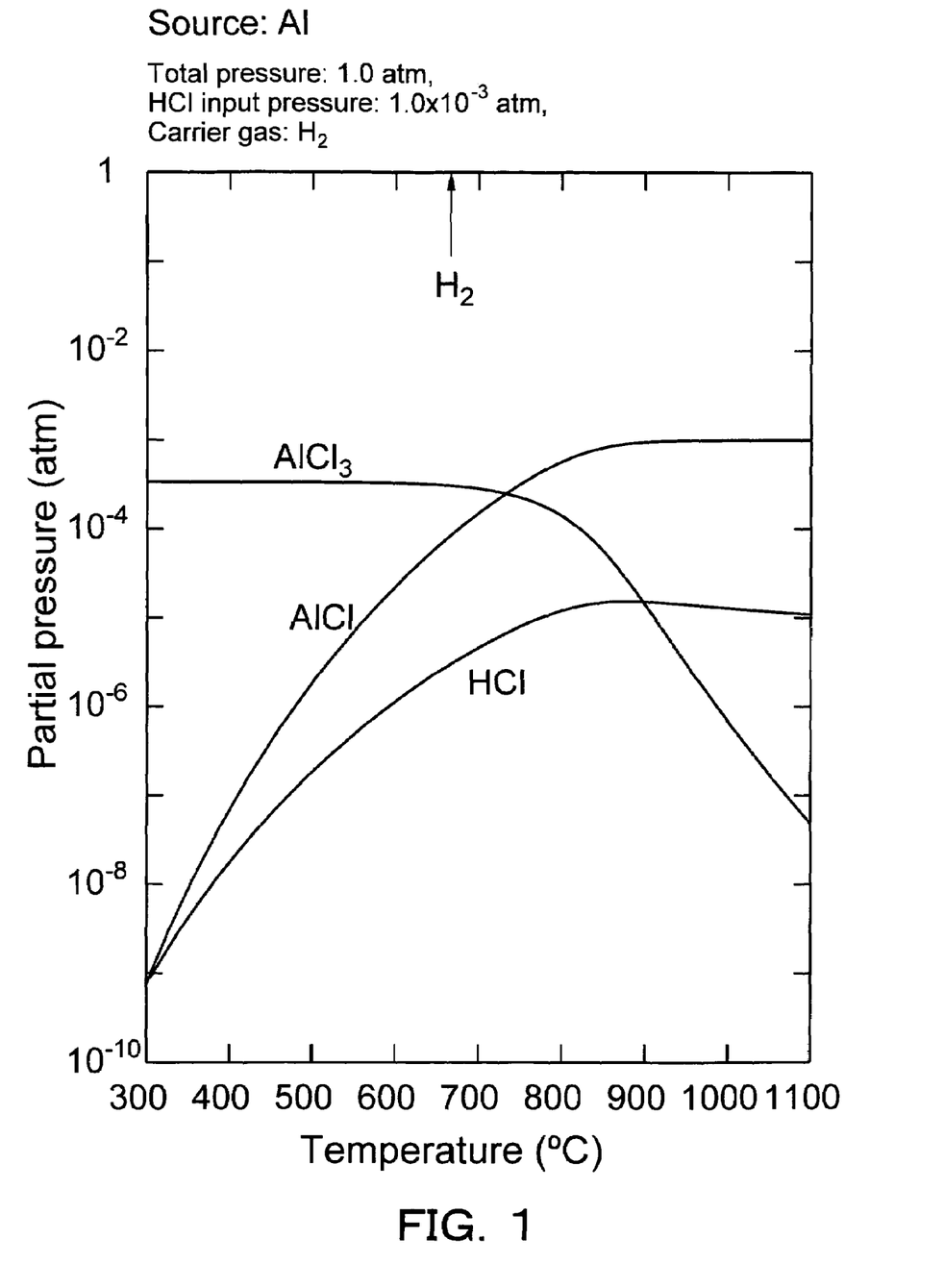
FIG. 1 is a graph showing relationships between temperature and the equilibrium partial pressures established by the reaction of Al with HCl.
Figure 2:
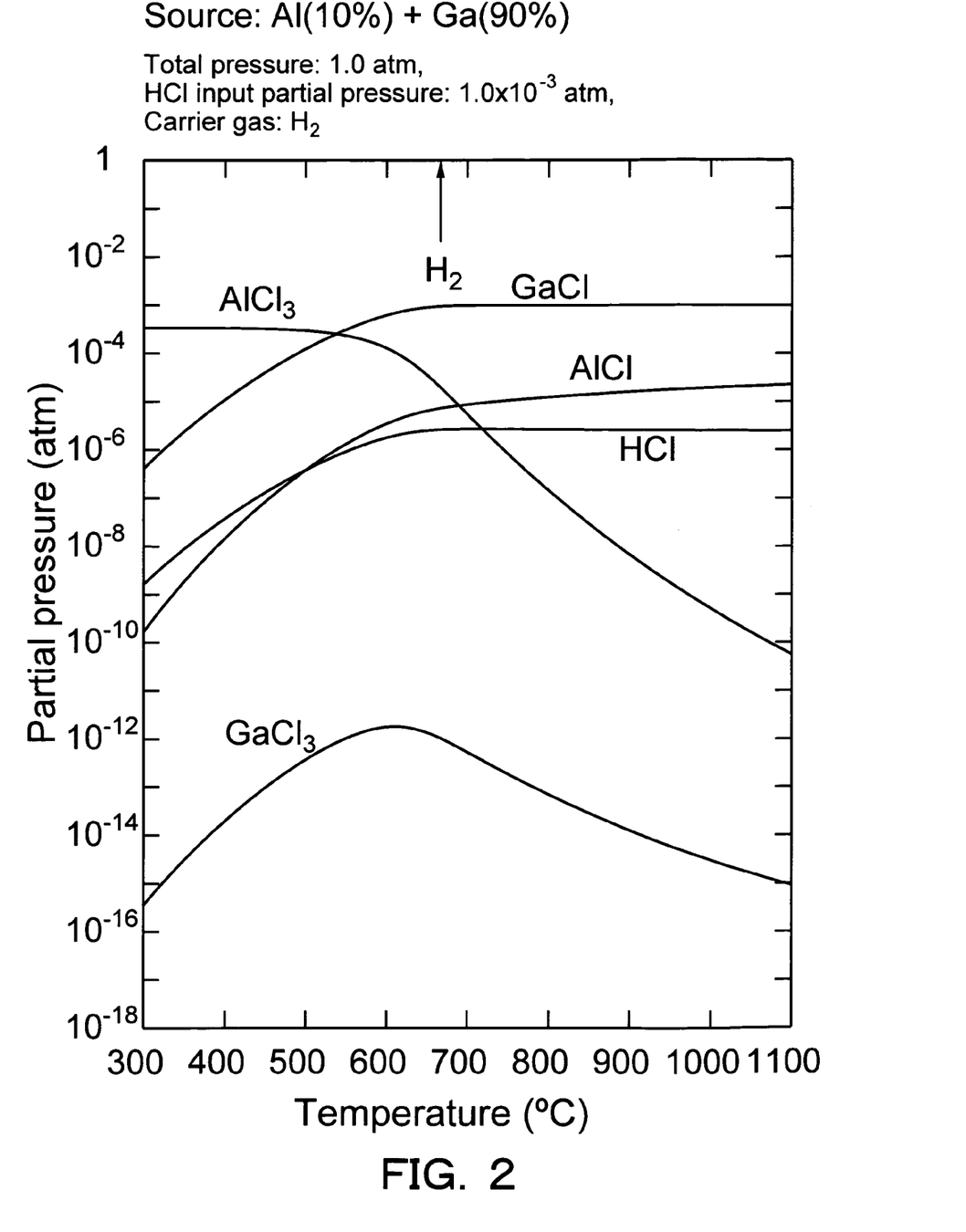
FIG. 2 is a graph showing relationships between temperature and the equilibrium partial pressures established by the reaction of a mixed material (10% Al+90% Ga) with HCl.

The mathematical equations 1 through 7 are together solved to determine the equilibrium partial pressure of each of the seven gas species as a function of temperature. The results are plotted on a graph with the vertical axis corresponding to the equilibrium partial pressure and the horizontal axis to temperature, to give FIGS. 1 and 2. FIG. 1 shows the results obtained when the metal material is composed only of Al, whereas FIG. 2 shows the results obtained when the metal material is a mixture of Al and Ga (10% Al content). The figures show the temperature dependency of the equilibrium partial pressure of each of the seven gas species.

The total pressure in the reaction tube is maintained at 1.0 atm with HCl gas delivered at an input partial pressure of $1.0\times10^{-3}$ atm. The carrier gas is composed only of hydrogen and contains no inert gas (IG). In each of FIGS. 1 and 2, the arrow shown at the top of the figure and denoted by $H_2$ indicates that the partial pressure of $H_2$ is approximately 1.0 atm. It should be noted that the vertical axis represents the partial pressure of the gases on a logarithmic scale.

As can be seen from the results shown in FIG. 1 where the material is composed only of Al, AlCl is predominantly produced when the temperature of the material area is 700° C. or above with $AlCl_3$ produced in a lesser amount, whereas the equilibrium partial pressure of $AlCl_3$ dominates that of AlCl when the temperature of the material area is 700° C. or below. In other words, generation of AlCl, which reacts with the quartz reaction tube, is suppressed and the generation of $AlCl_3$, which does not react with the quartz reaction tube, becomes predominant at 700° C. or below.

When referring to FIG. 2, which shows the results where the material is a mixture of Al and Ga, it can be seen that also in this case the generation of $AlCl_3$ dominates that of AlCl when the temperature of the material area is 700° C. or below. The halogenated product is predominantly produced in the form of $AlCl_3$, which does not react with the quartz reaction tube.

In the case depicted in FIG. 2, halogenated products of Ga are also formed. Regarding these compounds, generation of GaCl dominates that of $GaCl_3$ over the entire temperature range. Luckily, neither of the halogenated products of Ga (i.e., GaCl and $GaCl_3$) is reactive with the quartz reaction tube and thus poses any problems.

Collectively, it can be concluded that the gaseous halogenated products of Al and Ga that do not react with the quartz reaction tube can be obtained at 700° C. or below. These halogenated products are transported to another zone that serves as the growth area, where the halogenated products are reacted with a hydrogenated product of a group V element. Once the gas has been transported to another zone where the material metal does not exist, the temperature can be raised to 700° C. or above since there is no chance that the monohalogenated product of Al is produced. In this way, the Al-containing III-V group compound semiconductor can be grown on the seed crystal (substrate crystal) of, for example, sapphire ($Al_2O_3$) or Si at a significant growth rate.

In summary, the present invention is a method for growing, by vapor phase epitaxy, a crystal of Al-containing III-V group compound semiconductor, which contains Al as a group III element, and is characterized in that it involves the step of reacting Al alone, or a mixture of group III metals including Al, with a halogenated hydrogen at a temperature of 700° C. or below to produce a halogenated product. The present invention is particularly suitable for use with hydride vapor phase epitaxy (HVPE).

Effective in suppressing the generation of AlCl, which reacts with the quartz reaction tube, the present invention also allows the production of mixed crystal semiconductors containing a group III metal other than Al, such as those containing an Al-V group compound and a Ga-V group compound, by taking advantage of the large growth rate of the HVPE technique, which is of a quartz reaction tube hot wall type.

Specifically, the halogenated hydrogen may be hydrogen chloride, hydrogen bromide, or hydrogen iodide. Al is reacted with the halogenated hydrogen at a temperature in the range of 300° C. to 700° C., preferably approximately 600° C.

The vapor phase epitaxial growth using HVPE in accordance with the present invention may be repeated to make an Al-containing III-V group compound semiconductor comprising multiple thick layers of III-V group compound semiconductors of different compositions, each containing Al as a group III element. This is effective when it is desired to gradually vary the lattice constant to ultimately form the surface of the substrate (seed crystal) for use in MBE or MOVPE, as well as in producing a harsh environment-resistant semiconductor, which is less susceptible to malfunction caused by radiation.

Accordingly, an Al-containing III-V group compound semiconductor including semiconductor layers of different compositions deposited on top of one another on the surface of a substrate crystal can be obtained by a process comprising a first step of reacting a solid Al with a halogenated hydrogen at a temperature of 700° C. or below to produce a halogenated product of Al; and a second step of reacting the halogenated product of Al obtained in the first step with a gas containing a group V element at a temperature of 700° C. or above on the surface of a substrate crystal so that an Al-containing III-V group compound semiconductor is grown in the vapor phase on the substrate crystal, wherein at least one of the amount of the halogenated hydrogen used in the first step; the amount of the inert gas used in the first step; and the amount of the gas used in the second step containing a group V element is varied.

In carrying out this process, care must be taken to avoid defects caused by discontinuity in the crystal lattice that arises on the interface between different compositions. To this end, it is preferred that any relevant amounts, including the amount of the halogenated hydrogen used in the first step, the amount of the inert gas used in the first step, and the amount of the gas used in the second step containing a group V element, be gradually varied, rather than being varied in a discontinuous manner. While the amounts of the gases may be varied by controlling the flow rate of the respective gases, these amounts may also be varied by controlling the input gas partial pressure. Needless to say, the resulting halogenated product of Al produced in the first step of this process also has a temperature of 700° C. or below. The generation of the monohalogenated product, which is reactive with quartz, can therefore be suppressed, allowing the use of quartz tubes or other equipment made of quartz.

Alternatively, a solid mixture of group III metals including Al may be used. In this way, halogenated products of other group III metals other than Al are generated and react with a gas containing a group V element. This further adds to the variation of compositions of III-V group compound semiconductors.

BEST MODE FOR CARRYING OUT THE INVENTION

A process and a hydride vapor phase epitaxy (HVPE) apparatus for the vapor phase growth of Al-containing III-V group compound semiconductors in accordance with the present invention will now be described.

Figure 6:
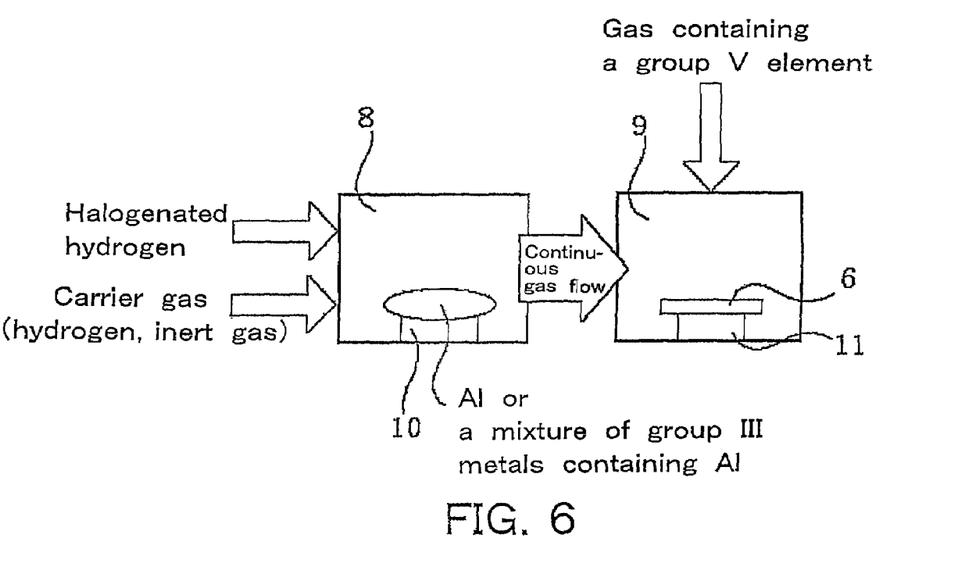
FIG. 6 is a schematic diagram showing a vapor phase growth apparatus for growing Al-containing III-V group compound semiconductors in accordance with the present invention.

As schematically shown in FIG. 6, the apparatus includes support means 10 for supporting a solid Al or a solid mixture of group III metals including Al; introduction means for introducing halogenated hydrogen (indicated by an arrow denoted by "halogenated hydrogen"); introduction means for introducing a carrier gas for the halogenated hydrogen (indicated by an arrow denoted by "carrier gas"); and a first reaction zone 8 maintained at a temperature of 300° C. to 700° C.

The carrier gas may be hydrogen, an inert gas, or a mixture of hydrogen and an inert gas. Examples of the inert gas are nitrogen and helium. Hydrogen is advantageously used because it brings little, if any, impurities into the resulting crystal.

The apparatus further includes support means 11 for supporting a seed crystal substrate; introduction means for introducing the halogenated product of Al generated in the first reaction zone (indicated by an arrow denoted by "gas flow"); introduction means for introducing a gas containing a group V element (indicated by an arrow denoted by "gas containing a group V element"); and a second reaction zone 9 maintained at a temperature of 700° C. to 1300° C.

Figure 3:
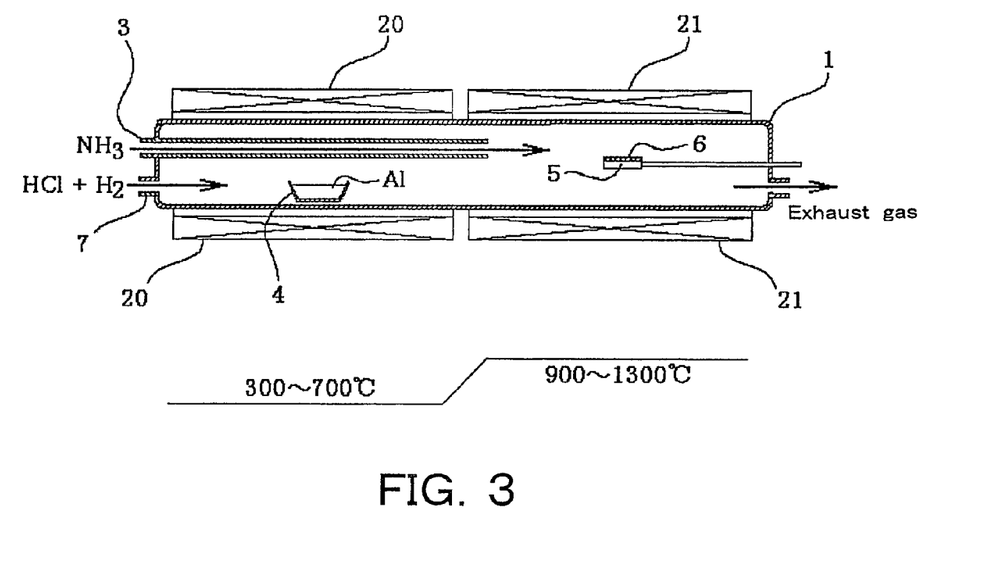
FIG. 3 is a cross-sectional view of one exemplary embodiment of a vapor phase growth apparatus of the present invention for growing Al-containing III-V group compound semiconductors, which is shown including a horizontal quartz reaction tube.

As with a known hydride vapor phase epitaxy (HVPE) apparatus, the apparatus can be constructed by using a horizontal quartz tube as shown in FIG. 3. A gas inlet 7 shown in FIG. 3 may serve as the introduction means for halogenated hydrogen shown in FIG. 6. FIG. 3 depicts one example in which hydrogen chloride gas, a halogenated hydrogen, is introduced by using hydrogen gas as a carrier gas.

While in this example, the halogenated hydrogen is premixed (mixed prior to introduction) with the carrier gas, and the inlet for the halogenated hydrogen is also serving as the inlet for the carrier gas, the two gases may be separately delivered from individual inlets without premixing. The carrier gas is introduced for the purposes of ensuring mixing of the gases for reaction and forming a continuous flow from the first reaction zone to the second reaction zone.

The construction shown in FIG. 3 is advantageous in that the first reaction zone 8 and the second reaction zone 9 are arranged adjacent to one another within the horizontal reaction tube 1, and first heating means 20 for heating to 300° C. to 700° C. and second heating means 21 for heating to 700° C. to 1300° C. are wound about the horizontal reaction tube 1 over the first reaction zone 8 and the second reaction zone 9, respectively.

The heating means may be a known resistor heater or a known radiation heater. Preferably, the temperature of the heating means 20 and 21 are controlled independently. The temperature control may be implemented by adjusting the density of the resistor wires or the location of the radiation source.

In FIG. 3, a reference numeral 1 denotes a quartz-made horizontal reaction tube with the heaters 20 and 21 wound thereabout.

Placed inside the reaction tube are an alumina-made Al boat 4 for containing Al to serve as the starting material in this example and a Si substrate 6 to serve as a seed crystal for vapor phase epitaxial growth. The Al boat 4 is heated by the heater 20 to 300° C. to 700° C. In this example, the surrounding area of the Al boat 4 serves as the first reaction zone 8 (not shown in FIG. 3).

Hydrogen chloride gas to serve as the halogenated hydrogen is introduced, along with hydrogen gas to serve as the carrier gas, through the first gas inlet 7 into the adjacent area of the Al boat 4, where a reaction takes place to produce aluminum trichloride ($AlCl_3$) as a halogenated product.

The reaction tube 1 also includes a material inlet 3 for introducing $NH_3$, the other material. The gaseous $NH_3$ serves as the gas containing N, a group V element, and is introduced through the material inlet 3. This gas is heated as it passes through the area heated to 300° C. to 700° C. by the heater 20 and is then sent to the adjacent area of the Si substrate 6 heated to 700° C. to 1300° C. by the heater 21. In this example, the adjacent area of the substrate 6 serves as the second reaction zone 9 (not shown in FIG. 3).

In FIG. 3, the continuous flow of the carrier gas that flows from the first reaction zone toward the second reaction zone serves as the introduction means in FIG. 6 for introducing the halogenated product of Al produced within the first reaction zone (indicated by an arrow denoted by "continuous gas flow"). In other words, the gas flow introduced into the first reaction zone carries the halogenated product of Al produced in the first reaction zone into the second reaction zone.

EXAMPLES

Comparative Example 1

Figure 4:
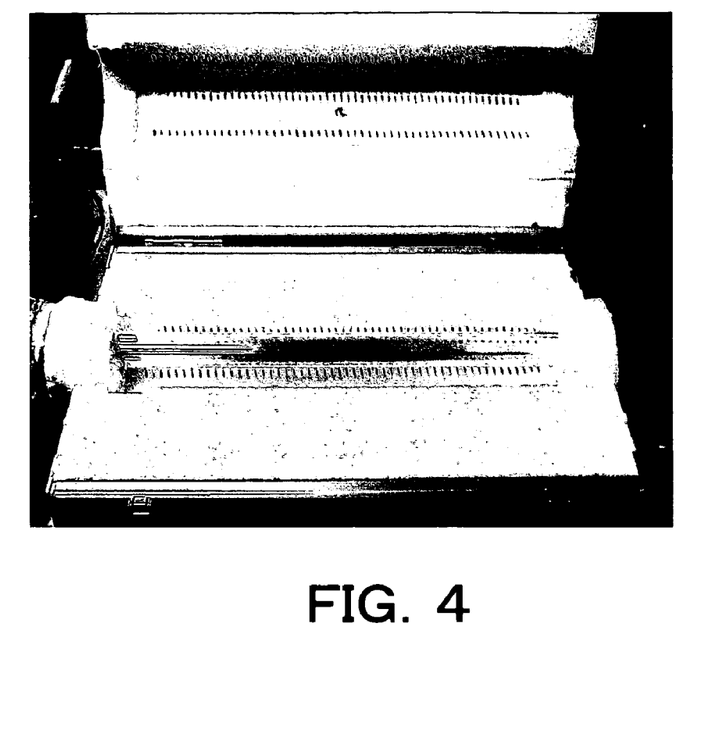
FIG. 4 is an explanatory view showing a photograph of a quartz reaction tube after the material has been transported at a temperature of 850° C. (1 hour reaction).

FIG. 4 shows a comparative example, in which the temperature of the Al material area was set to 850° C. (which falls outside the range specified by the present invention), and HCl and hydrogen were introduced into the Al material area with the temperature of the crystallization area set to 1000° C. FIG. 4 is a photograph showing the crystallization area of the reaction tube 1 hour after the experiment was started. Consistent with the discussion presented in the previous section of this description, the aluminum chloride (AlCl) transported from the material area into the crystallization area reacted with the quartz reaction tube that was heated to 1000° C., turning the inside of the quartz reaction tube yellow at its middle section. The yellow color comes from oxides of Al.

Example 1

Figure 5:
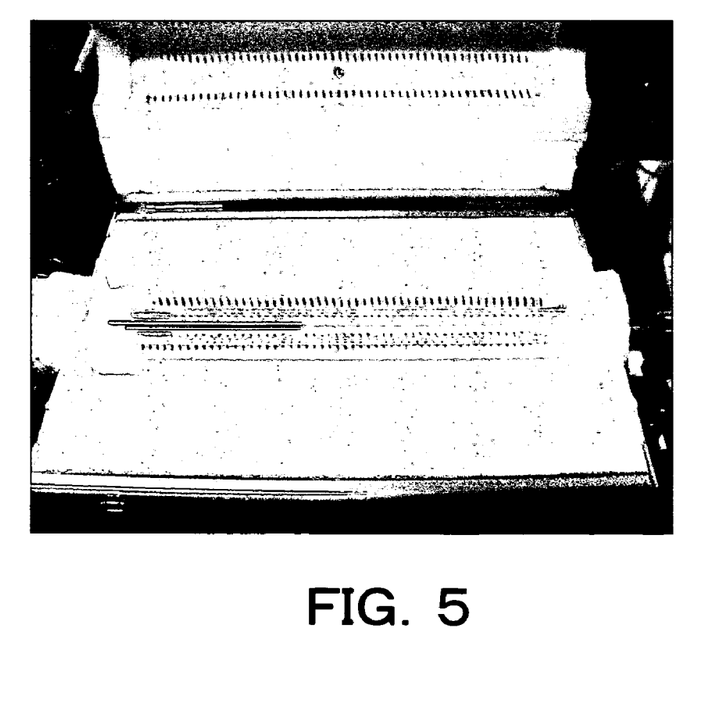
FIG. 5 is an explanatory view showing a photograph of a quartz reaction tube after the material has been transported at a temperature of 650° C. (5 hour reaction).

FIG. 5 shows one exemplary construction according to the present invention, in which the temperature of the Al material area was set to 650° C., and HCl and hydrogen were introduced into the Al material area with the temperature of the crystallization area set to 1000° C. FIG. 5 is a photograph showing the crystallization area of the reaction tube 5 hours after the experiment was started. Consistent with the previous discussion, substantially no aluminum monochloride (AlCl), the reactive species, was generated in the Al material area kept at 650° C. and the Al component was transported in the form of $AlCl_3$. As can be seen from the photograph, the quartz reaction tube exhibited no color change, demonstrating that the Al component can be transported without reacting with the quartz reaction tube by maintaining the temperature of the Al material area in the range of 300° C. to 700° C., the range specified by the present invention.

Example 2

Using the vapor phase growth apparatus shown in FIG. 3, epitaxial growth of AlN was carried out. Specific growth process was as follows: First, HCl was introduced along with hydrogen to serve as the carrier gas while the Al material area was maintained at 650° C. $NH_3$ and hydrogen to serve as the carrier gas were introduced while the temperature of the adjacent area of the Si substrate was varied from 900 to 1100° C. As a result, the reaction of $AlCl_3$ with $NH_3$ took place in the crystallization area in the vicinity of the Si substrate to cause the AlN crystal to epitaxially grow on the Si substrate.

The growth experiment was conducted in replicates with different HCl input partial pressures ranging from $1\times10^{-4}$ atm to $5\times10^{-2}$ atm and different $NH_3$ input partial pressures of 0.1, 0.2, 0.4, and 0.5 atm. As a result, it was proven that an AlN layer with high crystal quality was epitaxially grown on the Si substrate when the temperature of the Al material area was about 600° C.; the growth temperature was about 1000° C.; the HCl input partial pressure was $5\times10^{-3}$ atm; and the $NH_3$ input partial pressure was 0.2 atm.

Furthermore, the growth rate of as high as 200 microns/hour was achieved by increasing the HCl input partial pressure and the $NH_3$ input partial pressure. The rate was significantly higher when compared to 1-3 microns/hour by MOVPE and 1 micron/hour or less by MBE. This demonstrates that the method and the apparatus of the present invention are suitable for mass production and are thus industrially promising.

By replacing the Al material with a mixed material of 50% Al and 50% Ga, another vapor phase growth experiment was conducted to grow AlGaN crystals. While the mixed material was maintained at 600° C., the growth process was carried out under an HCl input partial pressure of $2\times10^{-3}$ atm and an $NH_3$ input partial pressure of 0.3 atm, and at a growth temperature of 1010° C. As a result, a high quality crystal of $Al_{0.4}Ga_{0.6}N$ was obtained at the growth rate of 50 microns/hour.

Although the present invention has been described with reference to particular improvements in the method and apparatus for hydride vapor phase epitaxy (HVPE), the present invention is not limited to such improvements and can generally be applied to vapor phase epitaxy technologies and apparatuses therefor that involve the use of halogenated products of Al.

The method and the apparatus for producing Al-containing III-V group compound semiconductors in accordance with the present invention have achieved a significantly fast growth rate and thus enable mass production of thick layers of Al-containing III-V group compound semiconductors at the practical level, which was deemed impossible. Accordingly, this technology, when used in substrate, enables mass production of various light sources operable at different wavelength bands, such as high intensity light-emitting diodes used in various display devices, lasers used for reading/writing CDs and DVDs, and lasers for optical communication. The method and the apparatus of the present invention also enable practical production of harsh environment-resistant semiconductors that are less susceptible, when formed into thick layer devices, to malfunctions caused by radiations.

The invention claimed is:

1. A method for growing a crystal of an Al-containing III-V group compound semiconductor containing Al as a group III element by vapor phase epitaxy in a reaction chamber made at least of quartz material, comprising:
    a first step of reacting a solid Al with a halogenated hydrogen at a temperature of from 300° C. to 650° C. to produce a halogenated product of Al, wherein the first step occurs in a first reaction zone of the reaction chamber; and
    a second step of reacting the halogenated product of Al produced in the first step with a gas containing a group V element on the surface of a substrate crystal so as to grow a III-V group compound semiconductor on the substrate crystal, wherein the second step occurs in a second reaction zone of the reaction chamber.

2. The method for growing a crystal of an Al-containing III-V group compound semiconductor containing Al as a group III element by vapor phase epitaxy according to claim 1, wherein the halogenated hydrogen is hydrogen chloride, hydrogen bromide, or hydrogen iodide.

3. The method for growing a crystal of an Al-containing III-V group compound semiconductor according to claim 2, wherein the halogenated hydrogen is hydrogen chloride.

4. A method for growing a crystal of AlN semiconductor by vapor phase epitaxy according to claim 1, wherein the second step comprises reacting the halogenated product of Al produced in the first step with a gas containing N.

5. The method for growing a crystal of an Al-containing III-V group compound semiconductor containing Al as a group III element by vapor phase epitaxy according to claim 1, wherein the second reaction zone is maintained at a temperature of 700° C. to 1300° C.

6. The method for growing a crystal of an Al-containing III-V group compound semiconductor containing Al as a group III element by vapor phase epitaxy according to claim 1,
    wherein the halogenated product of Al is $AlCl_3$ and the gas containing group V element is $NH_3$.

7. The method for growing a crystal of an Al-containing III-V group compound semiconductor containing Al as a group III element by vapor phase epitaxy according to claim 1,
    wherein the second step of reacting the halogenated product of Al produced in the first step with a gas containing a group V element is conducted at a temperature greater than 900° C.

8. A method for growing a crystal of an Al-containing III-V group compound semiconductor containing Al as a group III element by vapor phase epitaxy in a reaction chamber made at least of quartz material, comprising:
    a first step of reacting a solid mixture of group III metals including Al with a halogenated hydrogen at a temperature of from 300° C. to 650° C. to produce a halogenated product of group III, wherein the first step occurs in a first reaction zone of the reaction chamber; and
    a second step of reacting the halogenated product of group III produced in the first step with a gas containing a group V element on the surface of a substrate crystal so as to grow a III-V group compound semiconductor on the substrate crystal, wherein the second step occurs in a second reaction zone of the reaction chamber.

9. The method for growing a crystal of an Al-containing III-V group compound semiconductor containing Al as a group III element by vapor phase epitaxy according to claim 8, wherein the halogenated hydrogen is hydrogen chloride, hydrogen bromide, or hydrogen iodide.

10. The method for growing a crystal of an Al-containing III-V group compound semiconductor according to claim 9, wherein the halogenated hydrogen is hydrogen chloride.

11. The method for growing a crystal of an Al-containing III-V group compound semiconductor containing Al as a group III element by vapor phase epitaxy according to claim 8, wherein the second reaction zone is maintained at a temperature of 700° C. to 1300° C.

12. A method for producing an Al-containing III-V group compound semiconductor in a reaction chamber made at least of quartz material by repeating a vapor phase epitaxial growth process to deposit layers of III-V group compound semiconductors of different compositions containing Al as a group III element, the method comprising:

a first step of reacting a solid Al with a halogenated hydrogen at a temperature of from 300° C. to 650° C. to produce an halogenated product of Al, wherein the first step occurs in a first reaction zone of the reaction chamber; and a second step of reacting the halogenated product of Al produced in the first step with a gas containing a group V element on the surface of a substrate crystal so as to grow a III-V group compound semiconductor on the substrate crystal, wherein at least one of the amount of the halogenated hydrogen used in the first step, the amount of a carrier gas for the halogenated hydrogen used in the first step, and the amount of the group V element-containing gas used in the second step is varied to deposit III-V group compound semiconductors having different compositions, wherein the second step occurs in a second reaction zone of the reaction chamber.

13. The method for producing an Al-containing III-V group compound semiconductor according to claim 12, wherein the halogenated hydrogen is hydrogen chloride, hydrogen bromide, or hydrogen iodide, and the carrier gas for the halogenated hydrogen is hydrogen, an inert gas, or a mixture of hydrogen and an inert gas.

14. The method for producing an Al-containing III-V group compound semiconductor according to claim 13, wherein the halogenated hydrogen is hydrogen chloride.

15. The method for producing an Al-containing III-V group compound semiconductor according to claim 12, wherein the second reaction zone is maintained at a temperature of 700° C. to 1300° C.

16. A method for producing an Al-containing III-V group compound semiconductor in a reaction chamber made at least of quartz material by repeating a vapor phase epitaxial growth process to deposit layers of III-V group compound semiconductors of different compositions containing Al as a group III element, the method comprising:

a first step of reacting a solid mixture of group III metals including Al with a halogenated hydrogen at a temperature of from 300° C. to 650° C. to produce a halogenated product of Al, wherein the first step occurs in a first reaction zone of the reaction chamber; and a second step of reacting the halogenated product of Al and the halogenated product of group III metals other than Al produced in the first step with a gas containing a group V element on the surface of a substrate crystal so as to grow a III-V group compound semiconductor on the substrate crystal in the vapor phase, wherein at least one of the amount of the halogenated hydrogen used in the first step, the amount of a carrier gas for the halogenated hydrogen used in the first step, and the amount of the group V element-containing gas used in the second step is varied to deposit III-V group compound semiconductors having different compositions, wherein the second step occurs in a second reaction zone of the reaction chamber.

17. The method for producing an Al-containing III-V group compound semiconductor according to claim 16, wherein the halogenated hydrogen is hydrogen chloride, hydrogen bromide, or hydrogen iodide, and the carrier gas for the halogenated hydrogen is hydrogen, an inert gas, or a mixture of hydrogen and an inert gas.

18. The method for producing an Al-containing III-V group compound semiconductor according to claim 17, wherein the halogenated hydrogen is hydrogen chloride.

19. The method for producing an AL-containing III-V group compound semiconductor according to claim 16, wherein the second reaction zone is maintained at a temperature of 700° C. to 1300° C.

* * * * *